United States Patent
Altknecht et al.

(10) Patent No.: US 8,673,791 B2
(45) Date of Patent: Mar. 18, 2014

(54) METHOD AND APPARATUS FOR SUBSTRATE-MASK ALIGNMENT

(75) Inventors: David J. Altknecht, San Jose, CA (US); Robert E. Erickson, San Jose, CA (US); Christopher O. Lada, Los Gatos, CA (US); Stuart Stephen Papworth Parkin, San Jose, CA (US); Mahesh Samant, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 13/480,831

(22) Filed: May 25, 2012

(65) Prior Publication Data

US 2013/0316543 A1 Nov. 28, 2013

(51) Int. Cl.
*H01L 21/31* (2006.01)
*H01L 21/469* (2006.01)

(52) U.S. Cl.
USPC .......................................... 438/760; 438/763

(58) Field of Classification Search
USPC .................................. 438/760, 763
See application file for complete search history.

(56) References Cited

U.S. PATENT DOCUMENTS

| | | | |
|---|---|---|---|
| 6,063,436 A | 5/2000 | Pavell et al. | |
| 6,410,445 B1 | 6/2002 | Fagerman | |
| 7,268,431 B2 | 9/2007 | Brody et al. | |
| RE41,989 E | 12/2010 | Brody | |
| 8,050,081 B2 | 11/2011 | Park et al. | |
| 2002/0013022 A1* | 1/2002 | Yamazaki et al. | 438/166 |
| 2006/0066235 A1 | 3/2006 | Brody et al. | |
| 2006/0141763 A1 | 6/2006 | Brody et al. | |
| 2006/0281206 A1 | 12/2006 | Brody | |
| 2008/0014686 A1 | 1/2008 | Wang et al. | |
| 2009/0155011 A1* | 6/2009 | Erickson et al. | 409/234 |
| 2011/0131792 A1 | 6/2011 | Kwak et al. | |
| 2011/0250730 A1 | 10/2011 | Hopper et al. | |
| 2012/0129329 A1* | 5/2012 | Asami et al. | 438/585 |
| 2012/0244692 A1* | 9/2012 | Bateman et al. | 438/531 |

FOREIGN PATENT DOCUMENTS

| | | |
|---|---|---|
| EP | 2243855 A1 | 10/2010 |
| JP | 2004-119064 | 4/2004 |

OTHER PUBLICATIONS

Ambrose, Thomas et al. "38.2: Invited Paper: Fabrication of Thin Film Transistor Circuits Using Shadow Masking: A Low Cost Alternative to Conventional Lithography" SID Symp. Dig. of Tech. Papers vol. 42, Iss. 1 Jun. 2011 pp. 520-522.*

Kim, Gyuman et al. "Photoplastic shadow-masks for rapid resistless multi-layer micropatterning" Eurosensors Transducers '01 11th Int. Conf. on Solid-State Sensors and Actuators Jun. 14, 2001 pp. 1-4.*

Hong, Jung et al. "A novel micromachined shadow mask system with self-alignment and gap control capability" J. Micromech. Microeng. No. 18, Mar. 20, 2008 pp. 1-7.*

Kim, Gyuman "All-photoplastic microstencil with self-alignment for multiple layer shadow-mask patterning" Sensors and Actuators A 107 dated Oct. 15, 2003 pp. 132-136.*

* cited by examiner

*Primary Examiner* — Yu-Hsi D Sun
*Assistant Examiner* — Grant Withers
(74) *Attorney, Agent, or Firm* — Daniel E. Johnson

(57) ABSTRACT

A shadow masking device for use in the semiconductor industry includes self-aligning mechanical components that permit shadow masks to be exchanged while maintaining precise alignment with the target substrate. The misregistration between any two of the various layers in the formed structure can be kept to less than 40 microns.

20 Claims, 13 Drawing Sheets

METHOD AND APPARATUS FOR SUBSTRATE-MASK ALIGNMENT

TECHNICAL FIELD

The invention relates to a device for depositing material onto a substrate, and more particularly, to a device that permits the self-alignment of a shadow mask with respect to a substrate, thereby permitting different shadow masks to be used in turn.

BACKGROUND

Semiconductor devices are thin structures that are fabricated over the surface of a substrate by adding and removing material in several steps. Various layers are typically built up, with each layer having a composition and a form selected in view of the device design. The process may include steps to alter the properties of certain deposited materials, e.g., through ion implantation or annealing. In addition, chemical-mechanical planarization may be used to smoothen out the layers as they are built up.

The patterning of deposited material usually involves lithography. First, a uniform layer of material is deposited on the entire surface of the substrate. Unwanted material is then removed by an etching process, such as wet etching or dry etching (e.g., plasma etching or ion milling). Lithography permits certain portions of the layer to be removed while others remain. A typical lithographic process involves coating a layer with a photo-sensitive resist, selectively exposing the resist to a specific wavelength of light using focusing optics and a mask, chemically washing away the exposed (or alternatively, unexposed) portions of the resist, etching away parts of one or more layers, and then removing the remaining resist before proceeding to the next step. These steps involve the use of expensive equipment and can be time consuming.

Shadow masking is an alternative patterning method that does not rely on a lithographic process. Instead, a mask of a desired pattern is placed between the deposition source and the substrate, so that only material that passes through openings in the mask is deposited on the substrate. The mask is ideally positioned as close to the substrate as possible, so that the deposited pattern does not become "defocused" on the substrate; rather, the resulting deposited pattern is very nearly an exact copy of the mask. With shadow masking, the achievable feature sizes are limited by mask manufacturing capabilities, and precision mechanical alignment is required between the mask and the substrate. Nevertheless, shadow masking permits the rapid prototyping of devices, is significantly cheaper (since expensive processing equipment, such as steppers and etchers are not needed), generally involves fewer process steps than lithography, and does not require the use of harsh chemicals.

SUMMARY

Shadow mask apparatuses and methods are disclosed in which the mask is accurately aligned to the substrate. Unlike a lithographic process, in which a mask is aligned optically in a separate system (such as a stepper), the alignment of the shadow mask in this invention occurs automatically in the deposition process chamber. Mechanical alignment methods (rather than expensive optical ones) are used, which rely on self-aligning mechanical components.

In one preferred implementation of the invention, a first pattern of material is deposited over a substrate held in a substrate carrier by employing a first shadow mask held in a first mask carrier. A second pattern of material is deposited over the first pattern of material by employing a second shadow mask held in a second mask carrier, with the mask carriers being exchanged by a robot. Each of the first and second masks self-align passively with the substrate carrier, so that the deposited, second pattern is aligned to within 40 microns of the deposited first pattern. In a preferred implementation, at least 3 (or even 5, 10, or more) different shadow masks are used to construct a multi-layered structure onto the substrate. The depositions may take place in vacuum, and the masks are exchanged by a robot. The substrate may be heated to an elevated temperature, e.g., greater than 200° C. or even 400° C. The substrate and the first shadow mask may advantageously rotate together while material is being deposited.

In a preferred implementation of the invention, a first pattern of material is deposited over a substrate held in a substrate carrier by employing a first shadow mask in combination with mechanical components that self-align with the substrate carrier. A second pattern of material is deposited over the first pattern of material by employing a second shadow mask in combination with mechanical components that self-align with the substrate carrier. The masks are exchanged by a robot, and any misregistration between the first pattern and the second pattern is less than 40 microns.

The following exemplary method can be used in conjunction with the embodiments described herein, in which:
(a) the first shadow mask is installed in a receiver;
(b) the first layer of material is deposited over the substrate;
(c) the first shadow mask is removed from the receiver;
(d) the second shadow mask is installed in the receiver;
(e) the second layer of material is deposited over the substrate; and
(f) the second shadow mask is removed from the receiver, with steps (a), (b), (c), (d), (e), and (f) being carried out in turn.

BRIEF DESCRIPTION OF THE DRAWINGS

FIG. 4, which includes

FIG. 5 includes FIGS. 5A, 5B, 5C, 5D, and 5E, in which.

FIG. 6, which includes

DETAILED DESCRIPTION

The invention described herein allows for multiple shadow masks to be used in the sequential deposition of layers of different materials onto a single substrate. In particular, the layers within the structures so formed are precisely aligned to each other, so that well-defined structures are formed. Furthermore, the disclosed shadow masking methods lend themselves to rapid prototyping.

Figure 1:
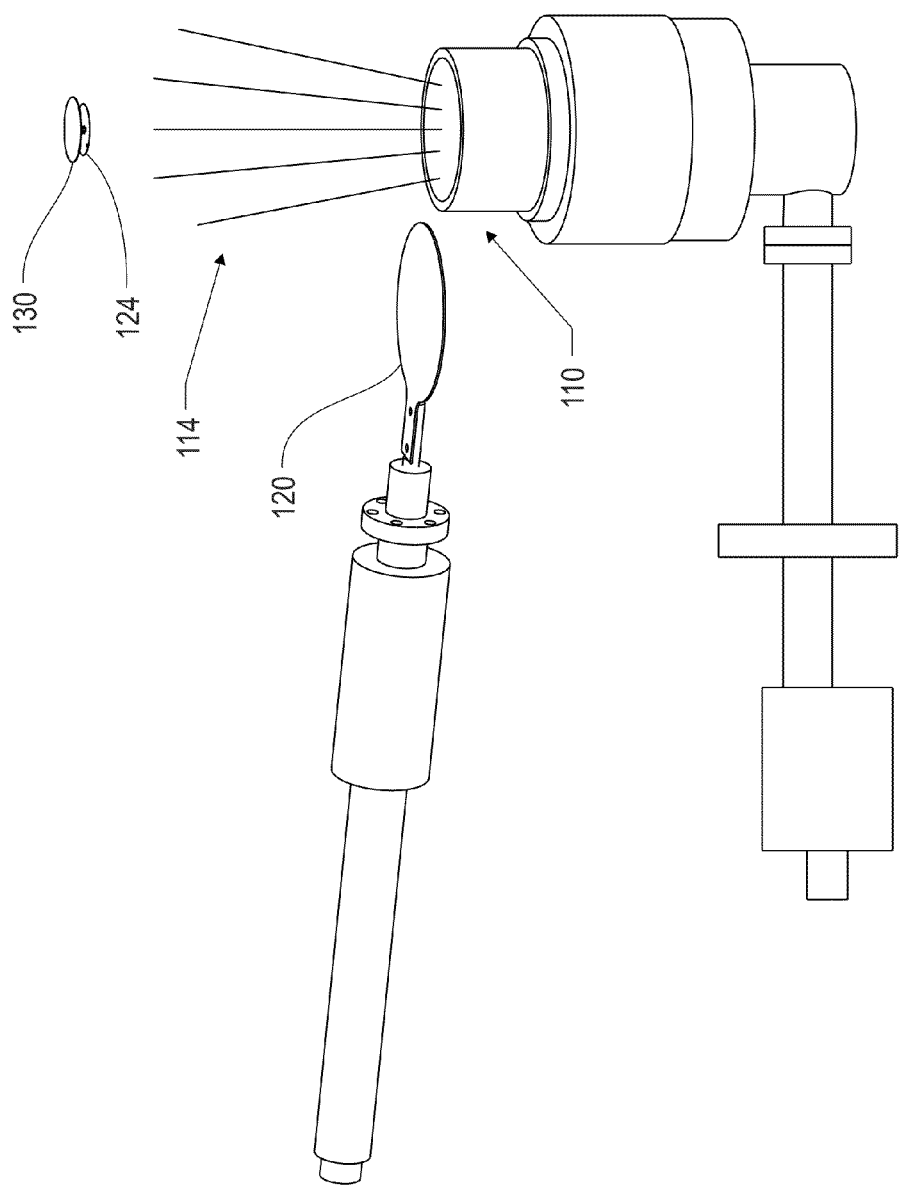
FIG. 1 is a high level illustration of the patterning of a substrate using a mask.
Figure 5A:
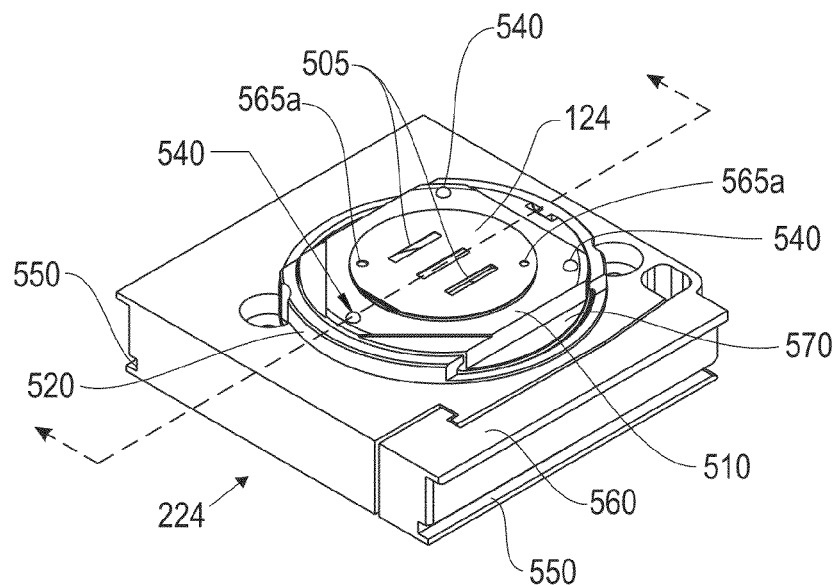
FIGS. 5A, 5B, and 5C show views of the mask carrier from the top, the bottom, and in cross section (taken along the cut shown), respectively.
Figure 5B:
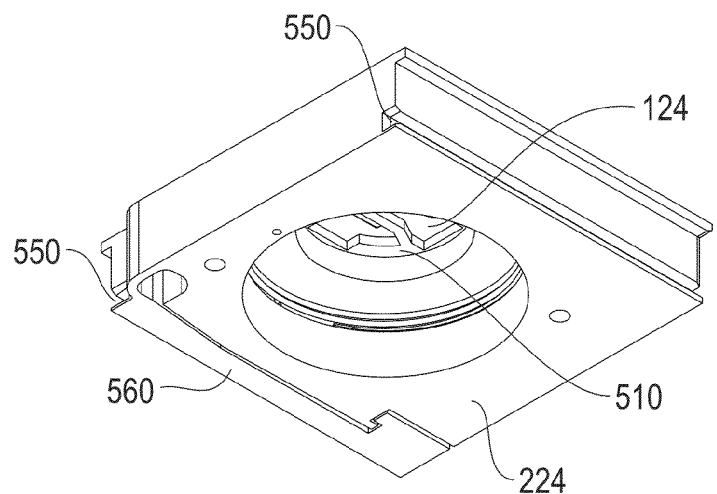
Figure 5C:
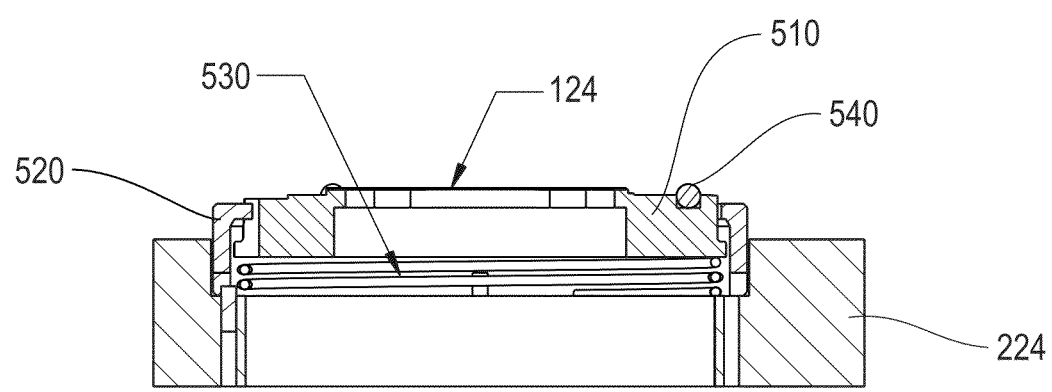
Figure 5D:
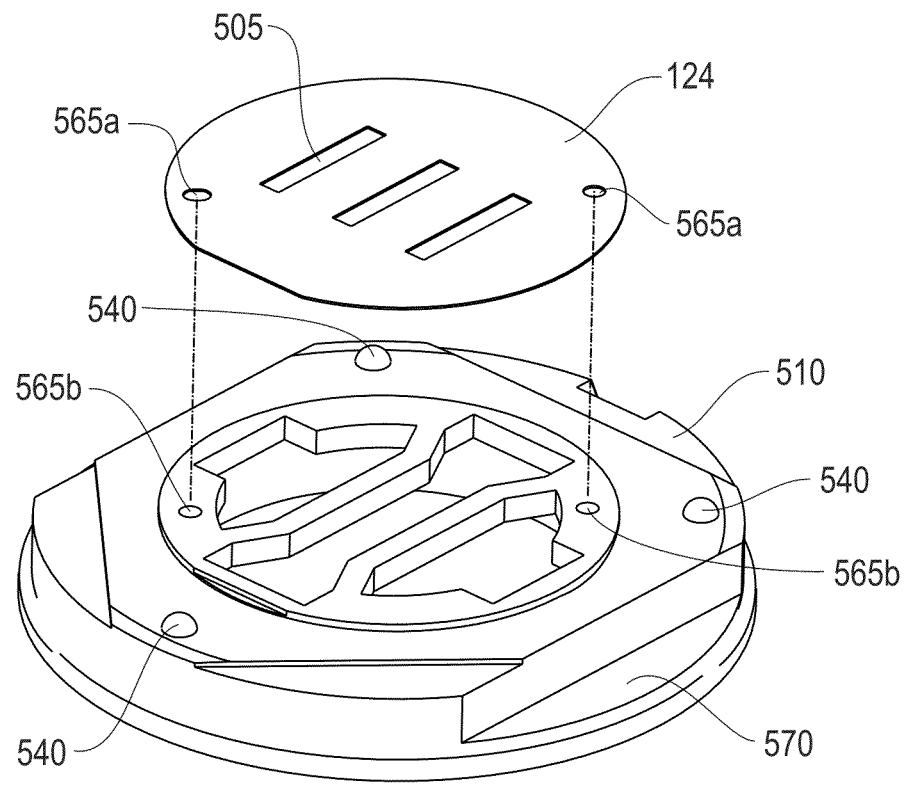
FIG. 5D shows an exploded view of a mask and its underlying support structure.
Figure 5E:
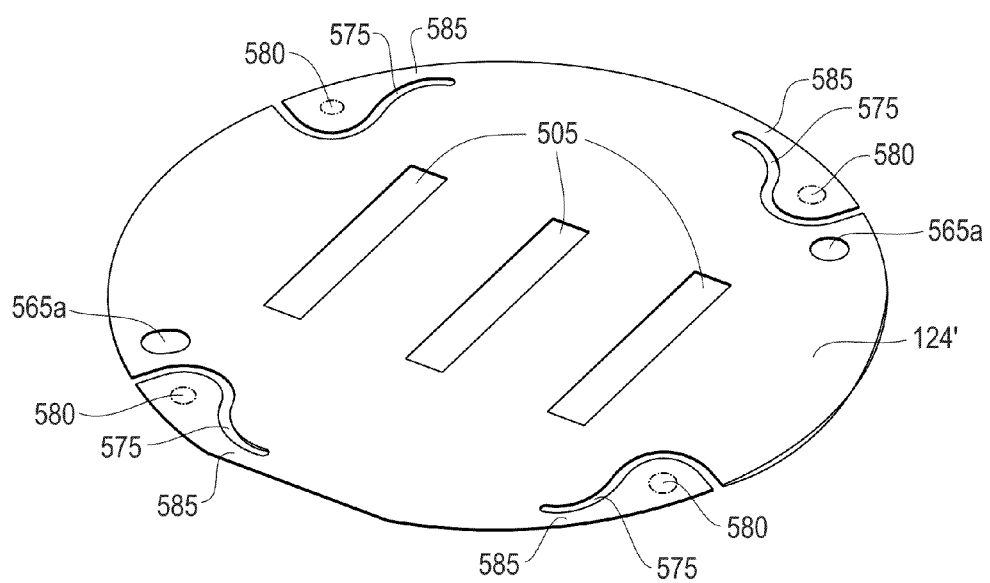
FIG. 5E shows an alternative mask designed for use at high temperatures.

Preferred embodiments of the invention are now described with respect to the figures. FIG. 1 is an overview of a shadow mask deposition apparatus and process, which may involve high temperatures, vacuum, and corrosive and/or oxidizing gases. A deposition source 110 provides the material 114 to be deposited, and a shutter 120 can be placed over the deposition source 110 to block the flow of material. The material 114 is directed towards a mask 124 that in turn is positioned near a wafer or substrate 130. The mask 124 generally has a thickness between 50 microns and 100 microns and preferably is made of a high-temperature material such as molybdenum or nickel-plated BeCu. The mask 124 includes openings 505 (as shown in FIG. 5A) that reflect the pattern of material to be deposited onto the substrate 130. Specifically, openings (such as slots) have been formed in the mask 124, so that the material 114 passing through these openings is deposited onto the substrate 130 to form a desired pattern on the wafer. The various elements shown in FIG. 1 and the other figures are advantageously contained within one or more chambers (not shown), so that vacuum can be applied during the deposition process.

Figure 2:
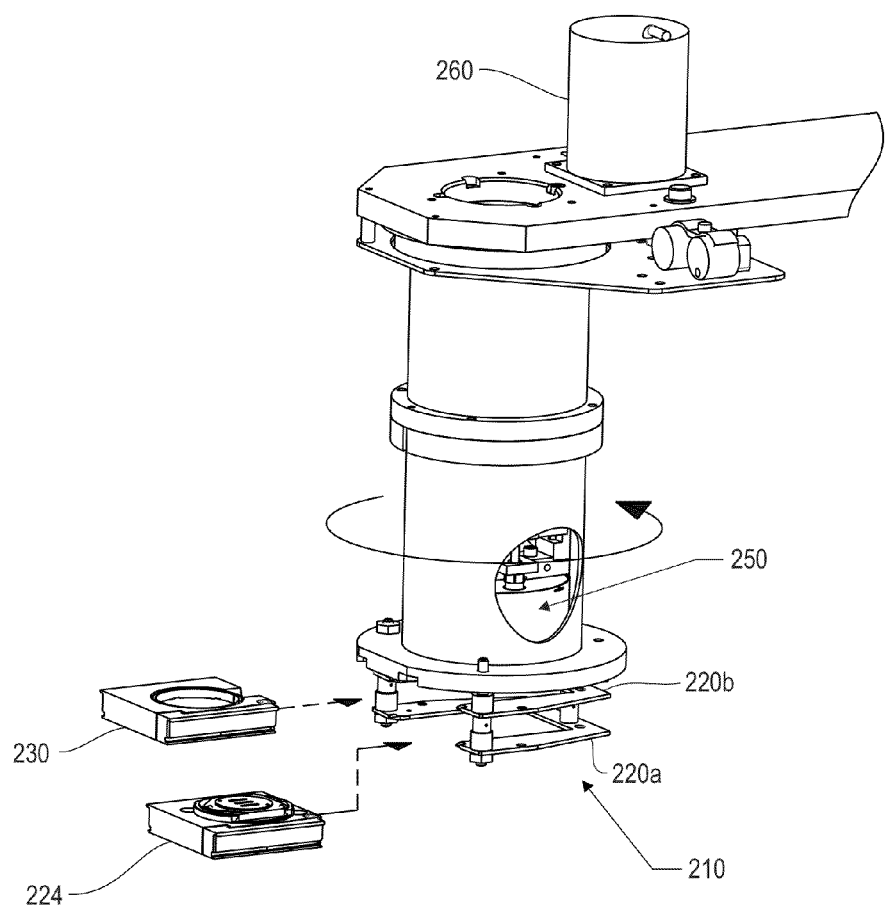
FIG. 2 shows a device that receives a substrate carrier and a mask carrier.
Figure 6A:
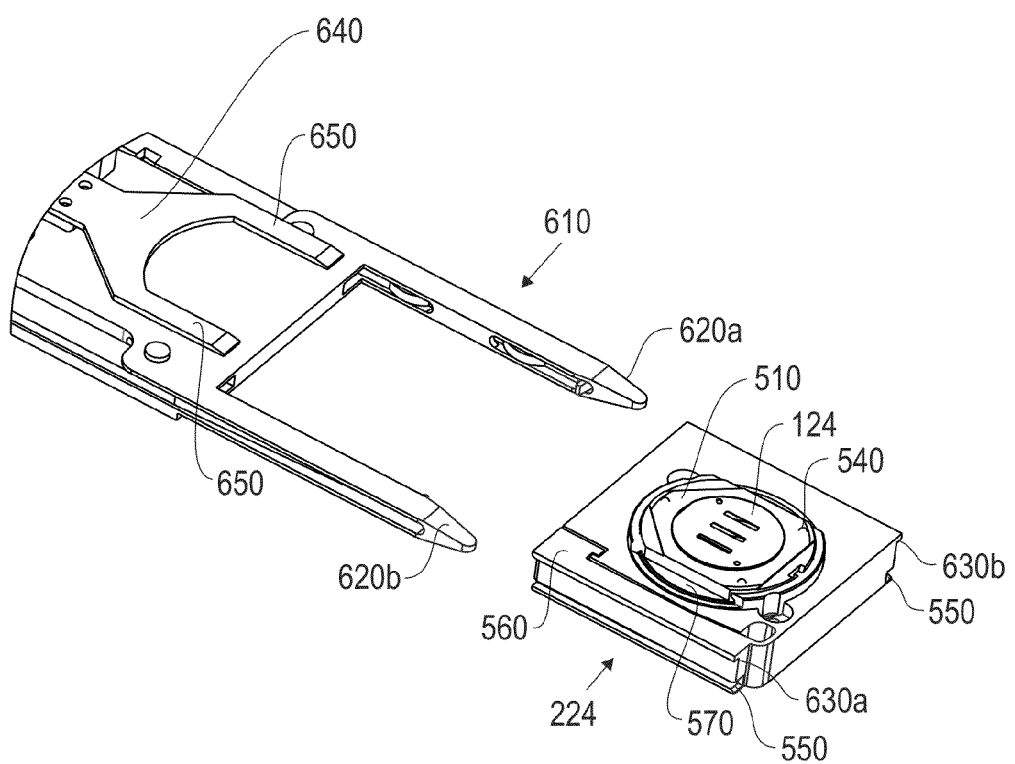
FIGS. 6A, 6B, and 6C, shows a robotic end effector that can be used to transport the mask carrier and the substrate carrier.
Figure 6B:
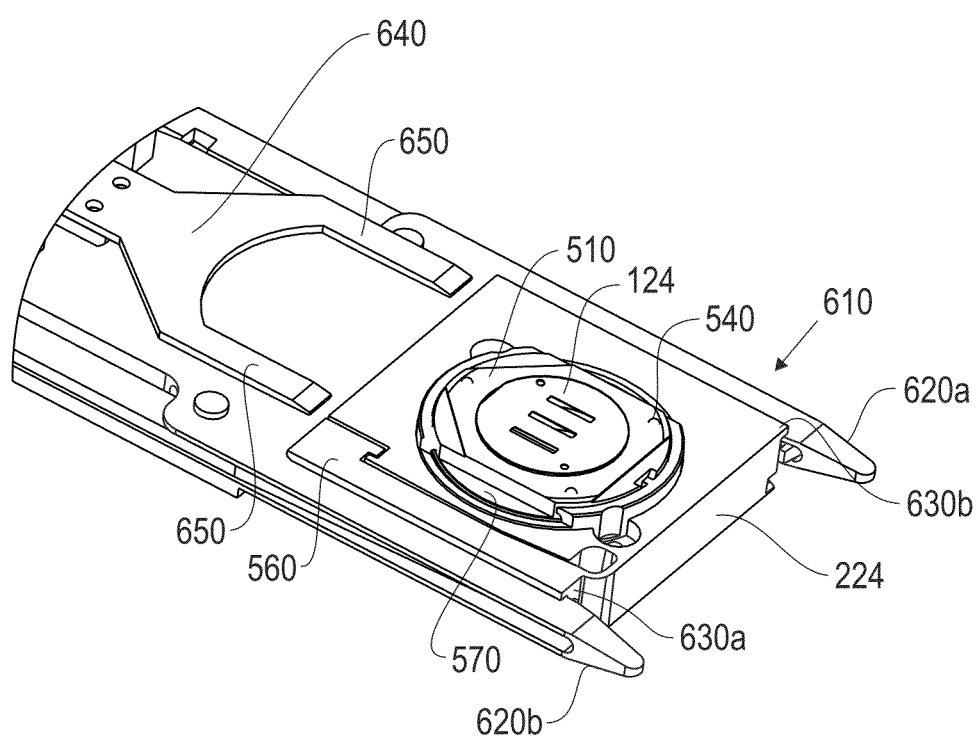
Figure 6C:
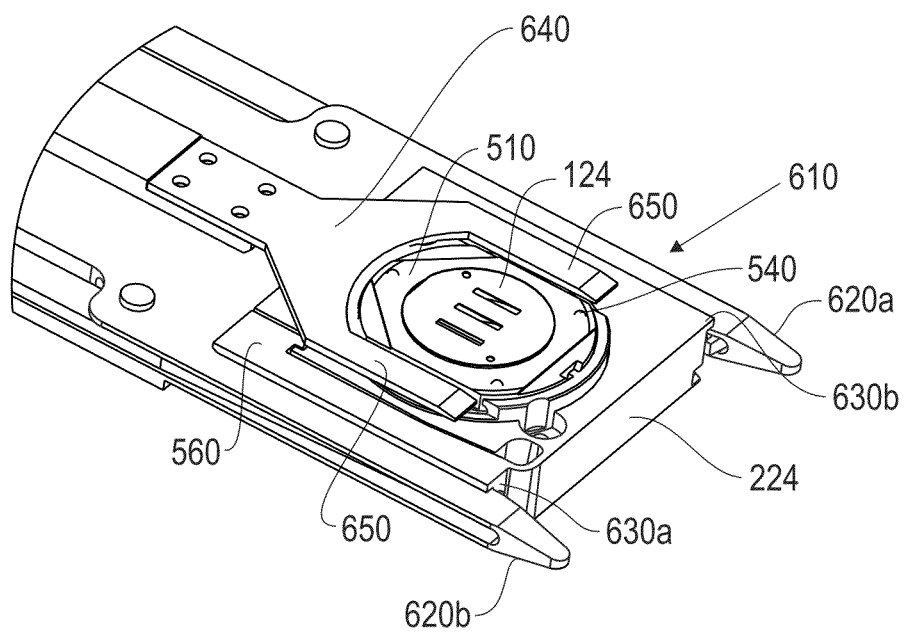

FIG. 2 shows a receiver assembly 210 that includes two receivers 220a, 220b for receiving a mask carrier 224 (that holds the mask 124) and a substrate carrier 230 (for holding the substrate 130), respectively. (Both the mask carrier 224 and the substrate carrier 230 can be made of a Ni—Cr—W—Mo alloy such as HAYNES® 230® alloy, which is resistant to both high temperature and oxidation.) As described in more detail below with respect to FIGS. 4 and 5, the mask carrier 224 and the substrate carrier 230 are constructed so that, when they are inserted into the receivers 220a, 220b, their positioning tolerance relative to each other is less than 0.4 mm (which is sufficient to permit the necessary finer adjustments to be made). The mask carrier 224 and the substrate carrier 230 can be independently exchanged in and out of the receivers 220a, 220b using a robot (as described below in connection with FIG. 6). In this manner, a different mask may be used for each deposited layer. For example, if ten different layers are to be deposited onto the substrate 130, ten different masks may be used in turn.

The receiver assembly 210 may advantageously include a heater assembly 250 (as seen in the cutaway portion of FIG. 2), thereby permitting heat to be directed onto the substrate 130. In this manner, temperatures up to 400° C., or even exceeding 1000° C., may be obtained during a deposition operation. As suggested by the arrow in FIG. 2, the receiver assembly 210 may be rotated, thereby facilitating more uniform thickness and composition of the materials deposited onto the substrate 130. To this end, a rotation motor 260 working with various gears and ball bearings (not shown) permit the motor to rotate the receiver assembly.

Figure 3:
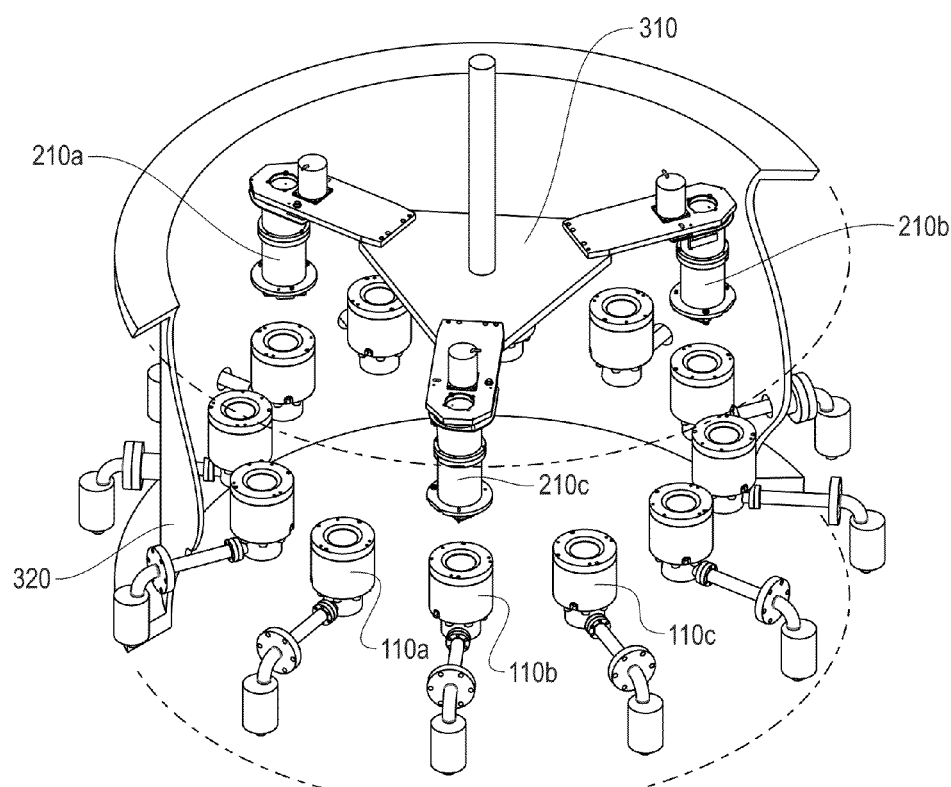
FIG. 3 shows an array of the devices shown in FIG. 2, in which each of the devices can be used with various deposition sources.

FIG. 3 shows an array 310 of receiver assemblies 210a, 210b, 210c that can be used in a deposition chamber 320 (shown in cutaway). The array 310 can be rotated with a rotation motor working in conjunction with various gears and ball bearings (not shown, but similar to the rotation motor 260 of FIG. 2), so that a particular receiver assembly 210a, 210b, or 210c is positioned directly over a desired deposition source. Twelve such deposition sources 110a, 110b, 110c, etc. are shown in FIG. 3, and each deposition source may be dedicated to a different material. Also, the mask carrier 224 may be exchanged out of the chamber 320 through a port (not shown). Thus, the configuration shown in FIG. 3 facilitates the rapid deposition of layers onto the substrate 130, in which each layer is patterned differently and is made of a different material.

Figure 4A:
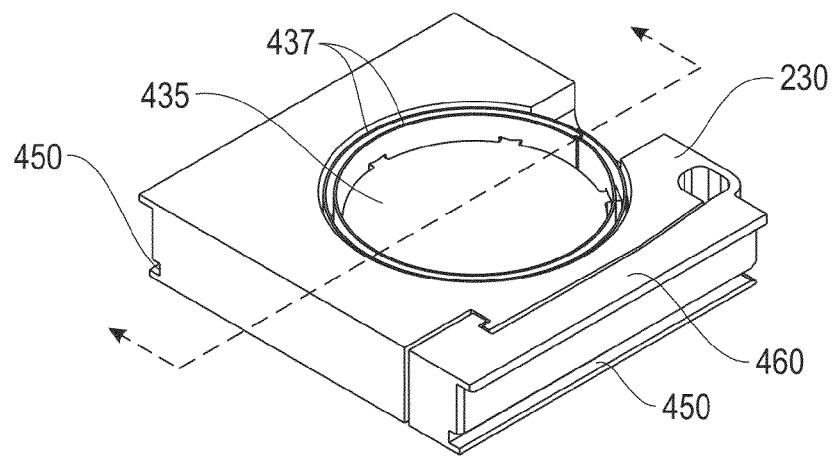
FIGS. 4A, 4B, and 4C, shows views of the substrate carrier from the top, the bottom, and in cross section (taken along the cut shown), respectively.

As now described with respect to FIGS. 4 and 5, the mask 124 (which include a pattern of openings 505) and the substrate 130 are aligned with respect to each other in a fixed and reproducible manner. This permits masks to be exchanged in a way that permits layers to be deposited over each other without significant misregistration. This is accomplished by i) fixing the position of the substrate 130 relative to the substrate carrier 230, ii) fixing the position of the substrate carrier 230 relative to the mask carrier 224, and iii) fixing the position of the mask 124 relative to the substrate carrier 230. Each of these will now be considered in turn.

Figure 4B:
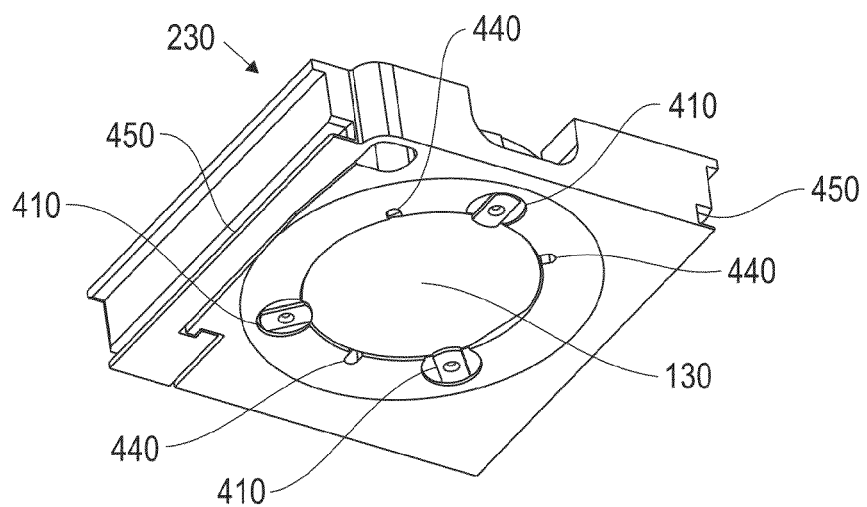
Figure 4C:
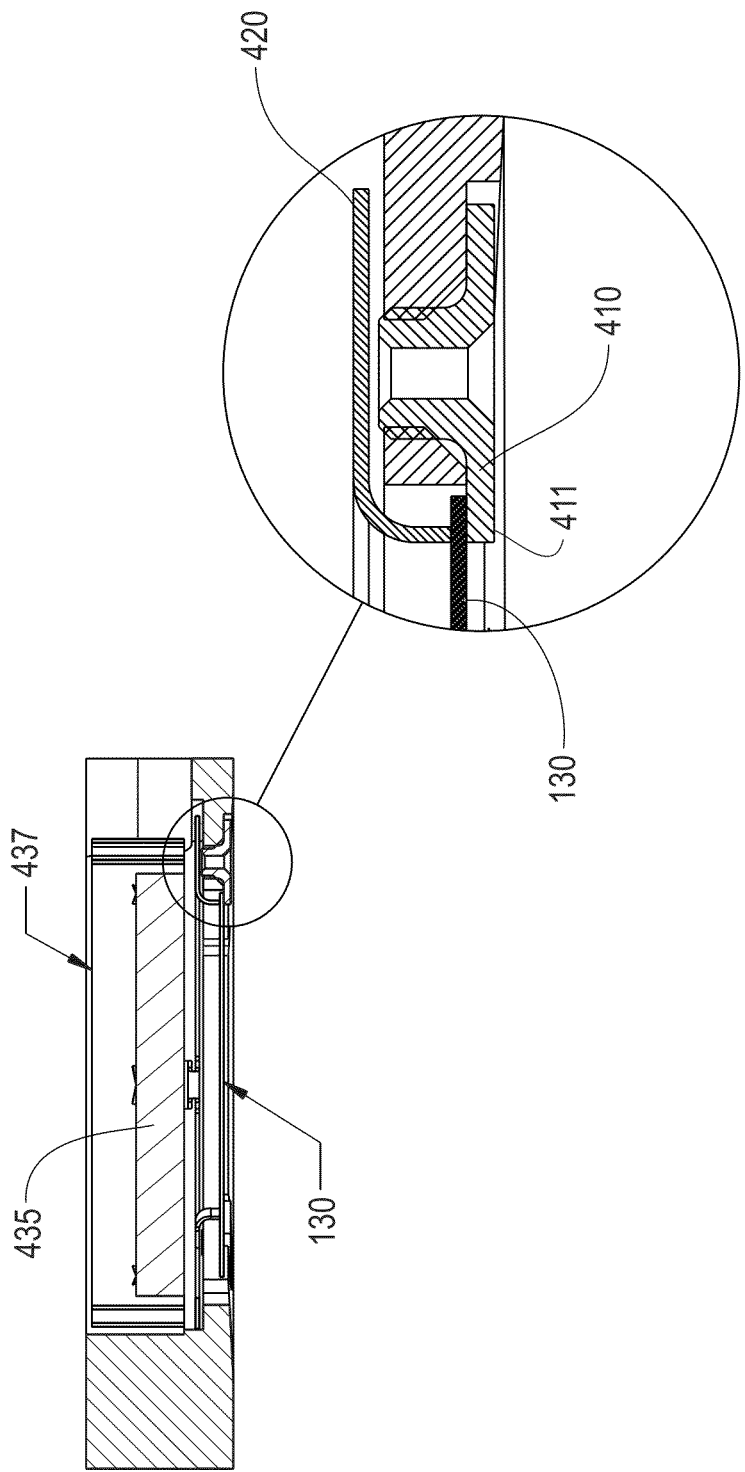

First, the positions of the substrate 130 and the substrate carrier 230 are fixed relative to one another as follows. (This is typically done beforehand in atmosphere, outside of any deposition chamber.) As shown in FIG. 4, the substrate carrier 230 includes three tabs 410 (e.g., made of Inconel 625®, a high-Ni content alloy that is resistant to both high temperature and oxidation) that are mounted in the substrate carrier but are free to rotate with respect to it. Insertion and removal of the substrate 130 into the substrate carrier 230 are possible when the flats of the tabs 410 are tangential to the circumference of the substrate. When the tabs 410 are rotated 90 degrees from this position, as shown in FIG. 4B, the tabs contact the substrate 130 at three places along its circumference. Three spring fingers 420 (e.g., made of Inconel 625®) on the side of the substrate 130 opposite the tabs 410 (see the inset in FIG. 4C) maintain a small force against the backside of the substrate to keep it in contact with the tabs. This pinching action prevents the substrate 130 from moving out of position relative to the substrate carrier 230. The thickness of each tab 410 at its end 411 is precisely machined (to within a tolerance of ±5 microns) using an electrical discharge machine (EDM) method; by controlling the thickness of each tab in this manner, the distance separating the substrate 130 from the mask 124 may be kept substantially constant (e.g., about 50 microns) across the face of the substrate, in accordance with the procedures discussed below in connection with FIGS. 4 and 5. (Note that additional components related to thermal management may be incorporated into the substrate carrier 230, such as a disk 435 (e.g., made of SiC) for heating the substrate 130, heat shields 437 (e.g., made of Inconel 625®), and slots (not shown) in the substrate carrier to help manage thermal conduction.)

Next, the positions of the substrate carrier 230 and the mask carrier 224 are fixed relative to one another as follows. As suggested by FIG. 2, the mask carrier 224 and the substrate carrier 230 are separately inserted into the U-shaped receivers 220a, 220b. (A robotic mechanism, such as the one described below in connection with FIG. 6, may be used for this purpose.) The receiver 220a has edges that engage longitudinal slots 550 in the mask carrier 224; likewise, the receiver 220b has edges that engage longitudinal slots 450 in the substrate carrier 230. The mask carrier 224 and the substrate carrier 230 have respective integral leaf springs 560 and 460, which provide a small restraining force to keep the carrier in place once it has been inserted into its corresponding receiver. Accordingly, the mask carrier 224 and the substrate carrier 230 are brought into coarse alignment when they are inserted into the receivers 220a, 220b, with a positioning tolerance of ±0.4 mm in each of the XYZ directions and ±1 degree about the vertical axis of the receiver assembly 210. This by itself is not good enough for the desired shadow masking operations, but when additional adjustments are made, as described below, the mask 124 and the substrate 130 can be aligned well enough to permit multiple layers to be deposited over each other, to within 40 microns of the desired alignment.

Finally, the positions of the mask 124 and the substrate carrier 230 are fixed relative to one another as follows. The mask 124 has been previously (and precisely, as described below with respect to FIG. 5D) spot welded to a mask plate 510, which is most clearly evident from the cross-sectional view of FIG. 5C. As a result of the welding process, the mask 124 and the mask plate 510 form an integral unit. The mask plate 510 fits within a retainer 520 of the mask carrier 224. The resulting structure ensures that the mask 124 remains substantially fixed with respect to the mask carrier 224, allowing for only limited lateral, vertical, and rotational motion of the mask with respect to the mask carrier. During deposition operations, a coiled wire spring 530 tends to urge the mask plate 510 upwards (see FIG. 5C), until the top portion of the mask plate contacts the three tabs 410. (On the other hand, when the mask carrier 224 is not in the receiver assembly 210, upward motion of the mask carrier 224 is constrained by the retainer 520, as suggested by FIG. 5C.) Preferred materials for the mask plate 510, the retainer 520, and the spring 530 include HAYNES® 230® alloy, Stainless Steel Type 304, and Inconel X750®, respectively.

Additional features in the top portion of the mask plate 510 interact with features in the substrate carrier 230 to ensure that, during deposition operations, the mask 124 remains fixed with respect to the substrate carrier (and hence the substrate 130). Specifically, three radial slots 440 in the substrate carrier 230 (see especially FIG. 4B) mate with the three alignment balls 540 of FIG. 5A. (The width of the slots 440 is preferably accurately machined using an EDM to a tolerance of ±5 microns.) The balls in turn are securely fixed within respective holes in the mask plate 510 and positioned within 3 microns of their target locations within the mask plate. When the top portion of the mask plate 510 is brought into contact with the three tabs 410 of the substrate carrier 230, the three alignment balls 540 simultaneously engage the three radial slots 440 to center the mask plate relative to the substrate carrier and to fix the angular orientation of the mask plate relative to the substrate carrier. At this point, the mask 124 is parallel to the surface of the substrate 130 and separated from it at a distance of nominally 50 microns. The three alignment balls 540 are preferably precision ground silicon nitride balls, such as those used in the manufacture of ball bearings. The balls 540 are ground to a high degree of sphericity (0.13 microns) and diametric tolerance (±1.3 microns) to ensure accurate alignment. In view of their smoothness, shape and hardness, the balls 540 also act as guiding surfaces for the mask plate 510 as the mask plate is brought into position. By using alignment balls 540 with various mask plates 510 (having respective masks 124), different masks can be aligned accurately and precisely with respect to the same substrate 130 (e.g., within 20 microns of the desired alignment, so that adjacent layers are aligned to within 40 microns of each other).

As noted above, the mask 124 is relatively thin, so that the mask plate 510 shown in FIG. 5 can help support the mask from deforming. As shown in FIG. 5D, the mask plate 510 need not be completely open where it underlies those portions of the mask 124 that do not include the openings 505; rather, the mask plate 510 can be used to provide support to the overlying mask 124. The mask 124 and the mask plate 510 can be spot welded together using the following procedure. First, holes 565a in the mask 124 can be aligned with holes 565b in the mask plate 510. Next, dowel pins (not shown) can be passed through the corresponding sets of holes to maintain alignment between the mask and the mask plate during the spot welding process. By adopting this procedure for each mask 124, with each mask having holes 565a in the same positions, one can exchange masks during a deposition process and expect the relative alignment between the mask and the substrate 130 to be the same for each mask/substrate combination.

If the mask 124 and the mask plate 510 are made from different materials, they will in general expand at different rates as the temperature increases, e.g., during a high temperature deposition process. To mitigate the problem of differential expansion of materials, an alternative mask 124', such as the one shown in FIG. 5E, may be used. The mask 124' includes slots 575 (four are shown) that are advantageously curvilinear or serpentine in shape. Portions 580 of the mask 124' between the slots 575 and the circumference of the mask 124' may be spot welded to the underlying mask plate 510 (not shown in FIG. 5E). Those portions 585 between the distal end of the slot 575 and the circumference of the mask 124' constitute the weakest portions of the mask 124', and thus are most likely to bend as the mask 124' expands. By using this design, the mask 124' is less likely to buckle in its middle, which could lead to distortion of the mask 124', misalignment of the mask 124' with respect to the mask plate 510, and/or physical contact between the mask 124' and the substrate 130. By employing a symmetrical arrangement of the slots 575, the mask 124' is more likely to maintain its desired alignment with respect to the mask plate 510.

The mask carrier 224 and the substrate carrier 230 are preferably transferred to the receivers 220a, 220b robotically. When this happens, the receiver assembly 210 (see FIG. 2) may be located inside the deposition chamber, where the material 114 is deposited onto the substrate 130; alternatively, the receiver assembly 210 may be in a chamber adjacent to the deposition chamber when the carriers 224, 230 are transferred. In principle, a number of different techniques and apparatuses may be employed to transfer the carriers 224, 230 to the receivers 220a, 220b; one approach is now described with reference to FIG. 6. A robotic end effector 610 includes two prongs 620a, 620b that slide underneath respective lips 630a, 630b of the mask carrier 224 (see FIG. 6A). Once the mask carrier 224 is held by the end effector 610 (see FIG. 6B), a compressor 640 moves forward and over the mask plate 510 (see FIG. 6C). At this point, the compressor 640 moves downward and touches surfaces 570 on opposite sides of the mask plate 510, thereby pushing the mask plate towards the mask carrier 224, which compresses the spring 530. With the mask plate 510 pushed down, the mask carrier 224 can be freely inserted into the receiver 220a, without touching the substrate carrier 230. After insertion, the compressor 640 is moved slightly upward, which permits the mask plate 510 to rise (as it is urged upwards by the spring 530). The alignment is complete once the mask plate 510 contacts the three tabs 410 (which are part of the previously inserted substrate carrier 230) and the alignment balls 540 mate with their counterparts (the radial slots 440). At this point, the spring 530 comes to an equilibrium position. Note that the fork tines 650 of the compressor 640 are designed to engage the surfaces 570, so that the tines no longer touch the mask plate 510 once the alignment is complete. This allows the fork tines 650 to be retracted without disturbing the alignment.

To remove the mask carrier 224 from the receiver 220a, this series of movements may be performed in reverse. Furthermore, the invention allows for masks 124 to be exchanged while leaving the substrate 130 and its substrate carrier 230 in the receiver assembly 210. The movement of the robotic end effector 610 and the compressor 640 may be controlled by a combination of mechanical components, such as gears, pulleys, levers, limit switches, and screws (not shown). Furthermore, the substrate 130 can be at deposition temperature when the masks 124 are exchanged.

EXAMPLES

Figure 7:
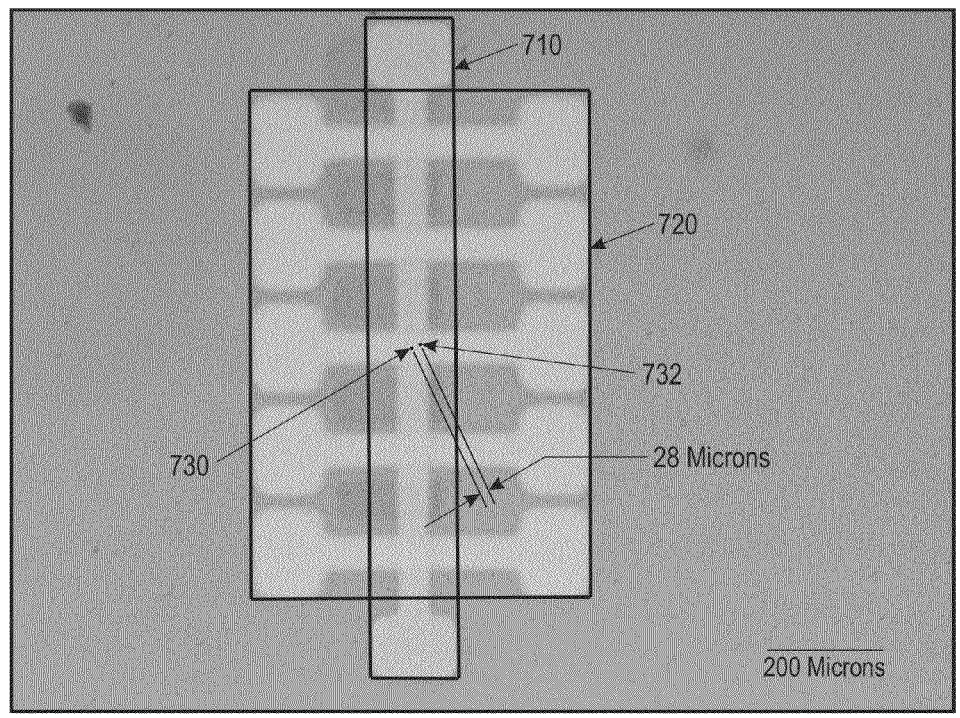
FIG. 7 is a picture of materials deposited over a substrate using the devices and methods described herein.

Using the devices and methods described herein, two layers of different materials were deposited onto a silicon wafer at room temperature (approximately 25° C.). The first material, an alloy of Mg/Ta/IrMn/CoFe having a thickness of 49 nm, is evident in FIG. 7 as a vertically oriented dogbone-shaped region encompassed by the box labeled 710. The second material, an alloy of CoFe/Ta/Ru having a thickness of 19 nm, was deposited on top of the first material and appears as 5 horizontally oriented dogbone-shaped regions encompassed by the box labeled 720. The geometric centers of the first and second materials are represented by the points 730 and 732, respectively, and are separated by 28 microns.

In a second experiment, first and second materials were deposited over a $TiO_2$ substrate that had been previously uniformly coated with a 10 nm thick layer of $VO_2$. Using the devices and methods described herein, 6 nm of $TiO_2$ (the first material) was deposited at room temperature over the substrate. This was followed by depositing 100 nm of Au (the second material) over the deposited $TiO_2$ at 400° C. The two deposited layers were found to be aligned to within 38 microns.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

The invention claimed is:

1. A method, comprising:
depositing a first pattern of material over a substrate held in a substrate carrier by employing a first shadow mask held in a first mask carrier; and
depositing a second pattern of material over the first pattern of material by employing a second shadow mask held in a second mask carrier, the mask carriers being exchanged by a robot,
wherein each of the first and second masks self-align passively with the substrate carrier, so that the deposited, second pattern is aligned to within 40 microns of the deposited first pattern.

2. The method of claim 1, wherein at least 3 different shadow masks are used to construct a multi-layered structure onto the substrate, with each layer of the multistructured layer being aligned to within 40 microns of each of the other layers.

3. The method of claim 1, wherein at least 5 different shadow masks are used to construct a multi-layered structure onto the substrate, with each layer of the multistructured layer being aligned to within 40 microns of each of the other layers.

4. The method of claim 1, wherein the depositions take place in vacuum.

5. The method of claim 1, wherein the substrate is at a temperature greater than 400° C. during the depositions.

6. The method of claim 1, wherein the substrate and the first shadow mask rotate together while material is being deposited.

7. The method of claim 1, wherein a first receiver accepts the mask carriers and a second receiver accepts the substrate carrier.

8. The method of claim 7, wherein:
(a) the first mask carrier is installed in the first receiver;
(b) the first layer of material is deposited over the substrate;
(c) the first mask carrier is removed from the receiver;
(d) the second mask carrier is installed in the first receiver;
(e) the second layer of material is deposited over the substrate; and
(f) the second mask carrier is removed from the receiver, with steps (a), (b), (c), (d), (e), and (f) being carried out in turn.

9. The method of claim 8, wherein the masks are exchanged while the substrate is at a temperature of at least 200° C.

10. The method of claim 1, wherein the substrate is not contacted by any of the masks while material is being deposited onto the substrate.

11. The method of claim 1, wherein:
the substrate carrier includes slots, the substrate carrier holding the substrate;
a first mask plate includes a first set of alignment balls, the first mask plate being secured to the first shadow mask, the first set of alignment balls engaging the slots to align the first shadow mask to the substrate when the first shadow mask is used in a deposition process; and
a second mask plate includes a second set of alignment balls, the second mask plate being secured to the second shadow mask, the second set of alignment balls engaging the slots to align the second shadow mask to the substrate when the second shadow mask is used in a deposition process.

12. A method, comprising:
depositing a first pattern of material over a substrate held in a substrate carrier by employing a first shadow mask in combination with mechanical components that self-align with the substrate carrier; and
depositing a second pattern of material over the first pattern of material by employing a second shadow mask in combination with mechanical components that self-align with the substrate carrier,
wherein any misregistration between the first pattern and the second pattern is less than 40 microns, and the masks are exchanged by a robot.

13. The method of claim 12, wherein at least 3 different shadow masks are used to construct a multi-layered structure onto the substrate, with each layer of the multistructured layer being aligned to within 40 microns of each of the other layers.

14. The method of claim 12, wherein at least 5 different shadow masks are used to construct a multi-layered structure onto the substrate, with each layer of the multistructured layer being aligned to within 40 microns of each of the other layers.

15. The method of claim 12, wherein the depositions take place in vacuum.

16. The method of claim 12, wherein the substrate is at a temperature greater than 400° C. during the depositions.

17. The method of claim 12, wherein the substrate and the first shadow mask rotate together while material is being deposited.

18. The method of claim 12, wherein:
(a) the first shadow mask is installed in a receiver;
(b) the first layer of material is deposited over the substrate;
(c) the first shadow mask is removed from the receiver;
(d) the second shadow mask is installed in the receiver;
(e) the second layer of material is deposited over the substrate; and
(f) the second shadow mask is removed from the receiver, with steps (a), (b), (c), (d), (e), and (f) being carried out in turn.

19. The method of claim 18, wherein the masks are exchanged while the substrate is at a temperature of at least 200° C.

20. The method of claim 12, wherein the substrate is not contacted by any of the masks while material is being deposited onto the substrate.

* * * * *